United States Patent [19]
Kim et al.

[11] Patent Number: 5,771,192
[45] Date of Patent: Jun. 23, 1998

[54] BIT LINE REFERENCE CIRCUIT FOR A NONVOLATILE SEMICONDUCTOR MEMORY DEVICE

[75] Inventors: Myong-Jae Kim; Tae-Sung Jung, both of Kyungki-do, Rep. of Korea

[73] Assignee: Samsung Electronics, Co., Ltd., Suwon, Rep. of Korea

[21] Appl. No.: 686,423

[22] Filed: Jul. 26, 1996

[30] Foreign Application Priority Data

Jul. 28, 1995 [KR] Rep. of Korea ............... 1995/22905

[51] Int. Cl.$^6$ ................................. G11C 11/34
[52] U.S. Cl. ..................... 365/185.17; 365/185.29
[58] Field of Search ................ 365/185.33, 185.29, 365/185.22, 185.17, 185.25, 185.01

[56] References Cited

U.S. PATENT DOCUMENTS 5,253,210  10/1993  Terada ................................ 365/203
5,299,162  3/1994   Kim et al. ........................... 365/189.01
5,541,879  7/1996   Suh et al. ........................... 365/185.22
5,548,146  8/1996   Kuroda et al. ....................... 365/185.01

*Primary Examiner*—Joseph A. Popek
*Assistant Examiner*—Michael T. Tran
*Attorney, Agent, or Firm*—Marger, Johnson McCollom, and Stolowitz P.C.

[57] ABSTRACT

A bit line reference circuit for a nonvolatile semiconductor memory device performs a referenced data access operation using a single bit line having upper and lower portions. The circuit has an open bit line structure and includes an upper memory cell string connected to the upper portion of the bit line, and a lower memory cell string connected to the lower portion of the bit line. An upper reference cell string is connected to the upper bit line for providing a reference potential to the upper bit line in response to a first control signal, while the lower memory cell string is selected. A lower reference cell string is connected to the lower bit line for providing a reference potential to the lower bit line in response to a second control signal, while the upper memory cell string is selected. A page buffer is connected between the upper and lower portions of the bit line and accesses data by comparing the potentials on the upper and lower portions of the bit line. Each reference cell string includes two transistors connected in series between the respective portion of the bit line and ground. The reference cell transistors are fabricated with the same process and structure as the transistors in the memory cell strings. The control gate and floating gate of each memory cell transistor are electrically coupled with an abutting contact.

20 Claims, 3 Drawing Sheets

BIT LINE REFERENCE CIRCUIT FOR A NONVOLATILE SEMICONDUCTOR MEMORY DEVICE

This application corresponds to Korean Patent Application No. 22905/1995 filed Jul. 28, 1995 in the name of Samsung Electronics Co, Ltd. which is herein incorporated by reference.

BACKGROUND OF THE INVENTION

1. Field of the Invention

This invention relates generally to bit line reference circuits for nonvolatile semiconductor memory devices and more particularly to a bit line reference circuit that uses a single bit line to access data in a memory cell string.

2. Description of the Related Art

Semiconductor memory devices, such as NAND type flash EEPROMs, typically employ a folded bit line architecture in which data is accessed by comparing a potential developed by a selected memory cell on one bit line with a reference potential on an adjacent bit line.

FIG. 1 shows a conventional bit-line reference circuit including reference cell strings and unit cell strings which are used for a referenced bit-line sensing operation. Unit cell block 120 includes unit cell strings CSi and CSi+1 which each have a NAND structure and are connected to bit lines BLi and BLi+1, respectively. Reference cell block 110 includes reference cell strings DCSi and DCSi+1 which generate reference potentials on the bit lines. Reference cell strings DCSi and DCSi+1 are connected to the corresponding unit cell strings CSi and CSi+1 and connected to the corresponding bit lines BLi and BLi+1, respectively. The reference cell block 110 has the same structure as the unit memory cell block 120.

To selectively switch each bit line, depletion mode transistors 100, 103, 105 and 106, and enhancement mode transistors 101, 102, 104 and 107 are connected in series by pairs, and selection signals DSG1, DSG2, SG1 and SG2 are applied to the gate terminals of the transistors. To perform a data access operation, a memory cell transistor (one of M0–M7) in the unit cell string CSi is selected (put into an operative state), and the unit cell string CSi+1 is deselected (put into an inoperative state), while the reference cell block 110 is activated to provide a reference potential to the bit line BLi+1. Then, a data resistor 130 (hereinafter referred to as a "page buffer"), which is comprised of two cross-coupled inverters, executes a data latching operation and compares the two bit line potentials to access the data.

A memory device having a folded bit line structure as shown in FIG. 1, however, has several disadvantages. One problem is that it employs depletion mode transistors for selecting bit lines. This increases the area of the memory cell array. Another problem is that, since the reference cell transistors in the reference cell strings have the same floating gate structure as the cell transistors of the unit memory cell strings, repetitious program and erasure operations cause the threshold voltage to shift. This shift in threshold voltage reduces the stability of the reference potential provided on the bit lines and causes the page buffer to fail to access data properly.

Accordingly, a need remains for a bit line reference circuit which overcomes the problems discussed above.

SUMMARY OF THE INVENTION

It is, therefore, an object of the invention to access data in a nonvolatile semiconductor memory device without using depletion mode transistors.

Another object of the invention is to reduce the size and cost of a semiconductor chip required for a nonvolatile semiconductor memory device.

A further object of the invention is to improve the reliability of data access operations in a nonvolatile semiconductor memory device.

A nonvolatile semiconductor memory device in accordance with the present invention utilizes an open bit line structure, so that a reference potential can be obtained within a signal bit line.

One aspect of the present invention is a bit line reference circuit for a nonvolatile semiconductor memory device comprising: a bit line having an upper portion and a lower portion; a page buffer connected between the upper and lower portions of the bit line; an upper reference cell string connected to the upper portion of the bit line for providing a reference potential to the upper portion of the bit line responsive to a first control signal; and a lower memory cell string connected to the lower portion of the bit line. The circuit also includes a lower reference cell string connected to the lower portion of the bit line for providing a second reference potential to the lower portion of the bit line responsive to a second control signal; and an upper memory cell string connected to the upper portion of the bit line.

The upper reference cell string includes a first transistor having a drain connected to the upper portion of the bit line, a source coupled to a ground terminal, and a control gate for receiving the first control signal. The upper reference cell string further includes a second transistor having a drain coupled to the source of the transistor, a source coupled to the ground terminal, and a control terminal for receiving a reference voltage signal. The transistors includes floating gates that is coupled to the control gates through an abutting contact exterior to the cell array.

Another aspect of the present invention is a method for accessing data in a nonvolatile semiconductor memory device using a single bit line, the method comprising: connecting a page buffer between an upper portion of the bit line and a lower portion of the bit line; connecting an upper reference cell string to the upper portion of the bit line; connecting a lower memory cell string to the lower portion of the bit line; providing a reference potential on the upper portion of the bit line with the upper reference cell string responsive to a control signal; selecting the lower memory cell string; providing a data potential on the lower portion of the bit line with the lower memory cell string; and comparing the potentials of the upper and lower portions of the bit line with the page buffer, thereby accessing data in the lower memory cell string.

Connecting the upper reference cell string to the upper portion of the bit line includes: coupling the drain of a first transistor having a control gate and a floating gate to the upper portion of the bit line; coupling the source of the first transistor to the drain of a second transistor having a control gate and a floating gate; coupling the source of the second transistor to a ground node; and coupling the control gate of the second transistor to the floating gate of the transistor, thereby stabilizing the threshold voltage of the second transistor.

The reference potential provided on the upper portion of the bit line can be adjusted by adjusting the size of at least one of the first and second transistors.

The foregoing and other objects, features and advantages of the invention will become more readily apparent from the following detailed description of a preferred embodiment of the invention which proceeds with reference to the accompanying drawings.

DETAILED DESCRIPTION

Figure 1:
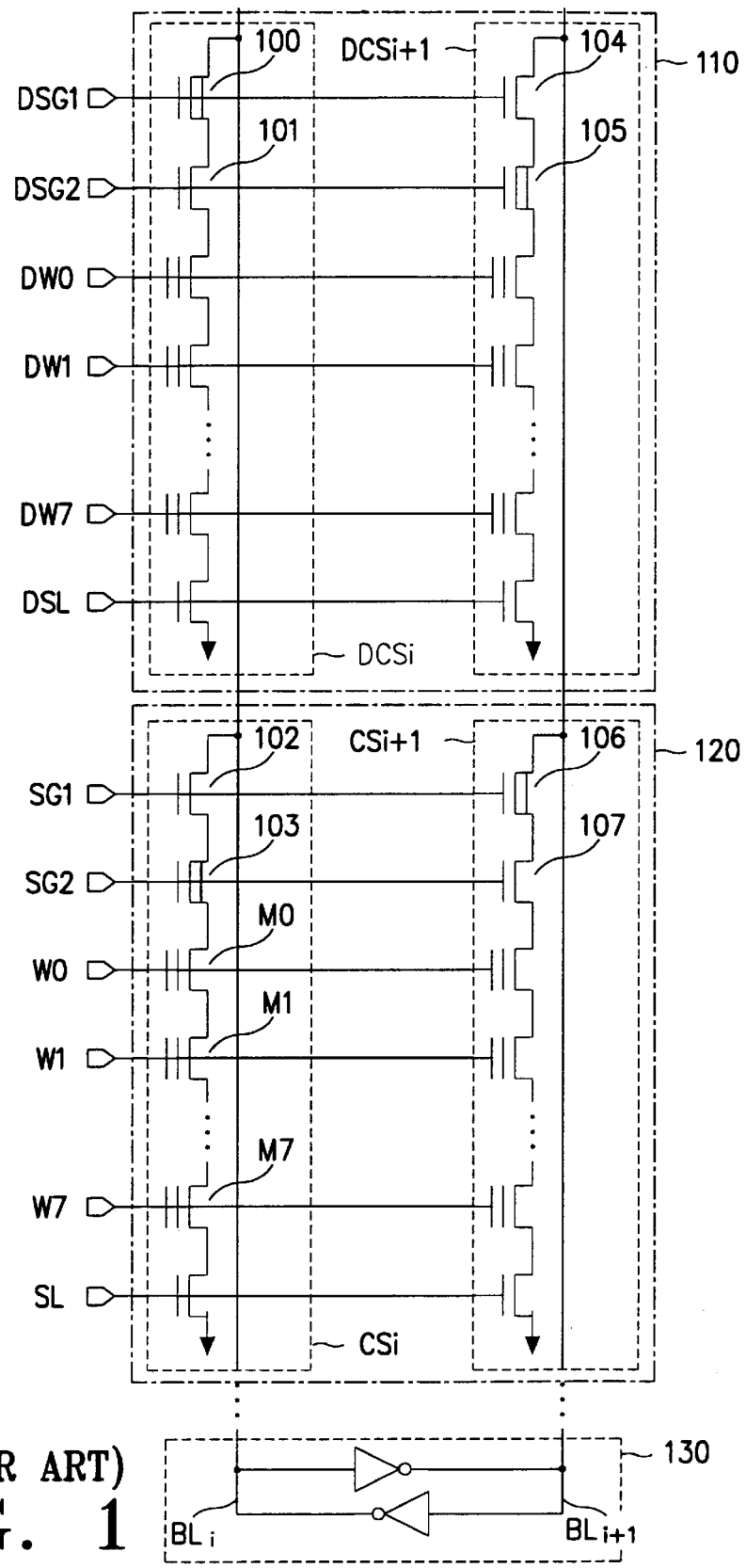
FIG. 1 is a schematic diagram of a prior art bit line reference circuit for a nonvolatile semiconductor memory device.
Figure 2:
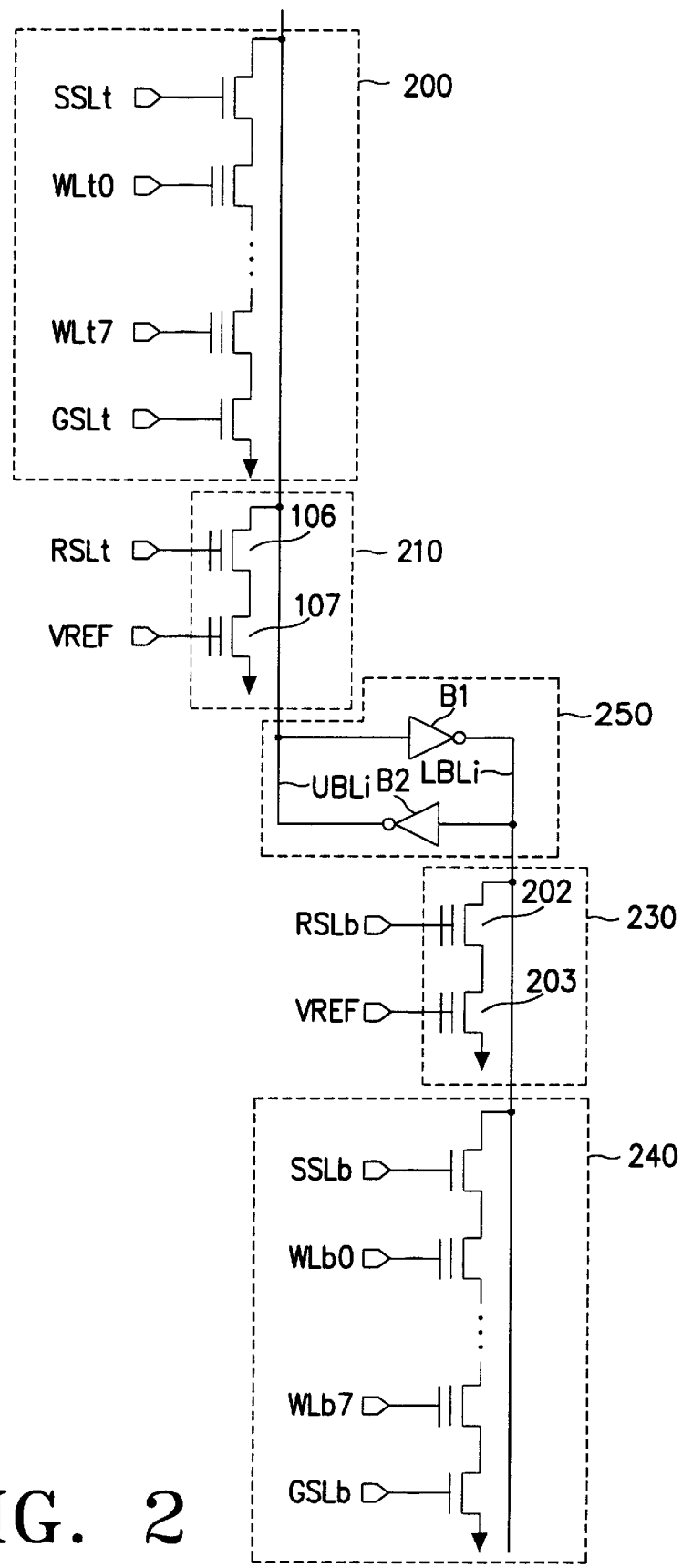
FIG. 2 is a schematic diagram of an embodiment of a bit line reference circuit in accordance with the present invention.

FIG. 2 is a schematic diagram of an embodiment of a bit-line reference circuit for a nonvolatile semiconductor memory device in accordance with the present invention. The structure of the circuit will first be described followed by a description of the operation.

The bit line reference circuit of FIG. 2 includes upper and lower memory cell strings 200 and 240. A single bit line includes an upper portion UBLi connected to the upper memory cell string 200 and a lower portion LBLi connected to the lower memory cell string 240. A page buffer 250 is connected between the upper and lower portions of the bit line. The page buffer includes a pair of cross-coupled inverters B1 and B2. Inverter B1 has an input terminal connected to the upper portion of the bit line UBLi and an output terminal connected to the lower portion of the bit line LBLi. The second inverter B2 has an input terminal connected to the lower portion of the bit line LBLi and an output terminal connected to the upper portion of the bit line UBLi.

An upper reference cell string 210 is connected between the upper portion of the bit line UBLi and a ground terminal and provides a first reference potential on the upper portion of the bit line in response to a first control signal RSLt. A lower reference cell string 230 is connected between the lower portion of the bit line LBLi and the ground terminal and provides a second reference potential to the lower portion of the bit line in response to a second control signal RSLb.

The upper reference cell string 210 includes a first transistor 106 having a drain connected to the upper portion of the bit line UBLi and a control gate that receives the first control signal RSLt. A second transistor 107 has a drain connected to the source of the first transistor 106, a source terminal connected to the ground terminal, and a control gate that receives a predetermined reference voltage signal VREF.

The lower reference cell string 230 includes a first transistor 202 having a drain connected to the lower portion of the bit line LBLi and a control gate that receives the second control signal RSLb. A second transistor 203 has a drain connected to the source of the first transistor 202, a source terminal connected to the ground terminal, and a control gate that receives the predetermined reference voltage signal VREF.

Figure 3A:
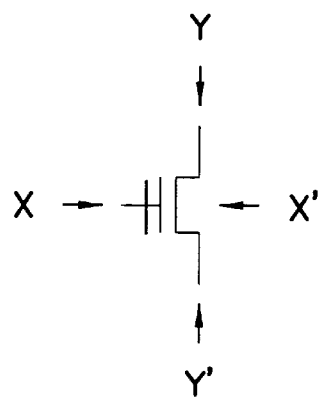
FIG. 3A is a view of an embodiment of a reference cell transistor in accordance with the present invention.
Figure 3B:
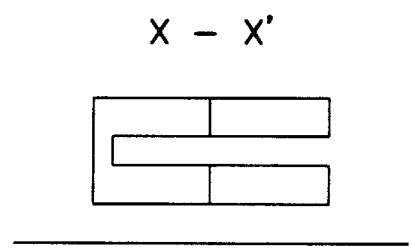
FIG. 3B is a sectional view of the structure of the transistor of FIG. 3A oriented along line X—X' in FIG. 3A.
Figure 3C:
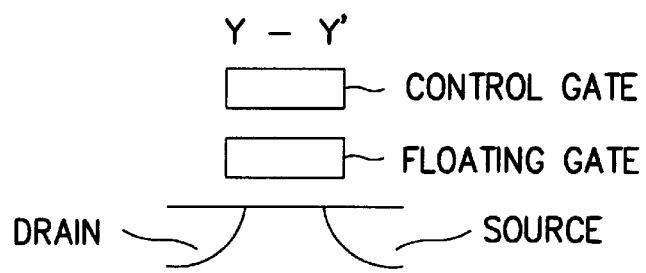
FIG. 3C is a sectional view of the structure of the transistor of FIG. 3A oriented along line Y—Y' in FIG. 3A.

Reference cell transistors 106, 107, 202 and 203 are fabricated with the same process as the transistors in the upper and lower memory cell strings, and therefore, have the same structure as the memory cell transistors. Thus, reference cell transistors 106, 107, 202 and 203 each have a floating gate in addition to a control gate as shown in FIGS. 3A and 3C. The control gate and floating gate of each of the reference cell transistors are interconnected, thereby forming a control electrode. This gives the reference cell transistors the same operational characteristics as a normal enhancement mode transistor. Referring to FIG. 3B, the floating gate of each reference cell transistor is electrically coupled to the control gate using an abutting contact exterior to the cell array.

A flash memory device according to the present invention can be fabricated with a plurality of memory cell units formed on a surface of a semiconductor substrate with each cell unit including a string select transistor and a string of memory transistors. The source and drain areas of the memory transistors are formed on the semiconductor substrate with a channel area between the source and drain areas. A polysilicon floating gate is formed over, and insulated from, the channel area, while a polysilicon control gate is formed over, and insulated from, the floating gate. The control gate of each memory transistor is coupled to a corresponding word line.

In operation, data in the lower memory cell string is accessed by activating the first control signal while the lower memory cell string is selected. The first control signal drives the control gate of transistor 106, and the control gate of transistor 107 is driven by a constant reference voltage level Vref. This causes upper reference cell string 210 to generate a reference potential on the upper portion of the bit line UBLi. The page buffer 250 reads the data by comparing the potential on the upper portion of the bit line UBLi with the potential generated on the lower portion of the bit line LBLi by the memory cell. The gate terminals of the first and second transistors 106 and 107 in upper reference cell string 210 are enabled simultaneously with the word line control signal which is input to the selected lower memory cell.

In a similar manner, data in the upper memory cell string is accessed by activating the second control signal while the upper memory cell string is selected. Thus, the first and second control signals will always have opposite logic levels.

The reference voltage provided by the reference cell strings can be easily adjusted by the adjusting the size of the transistors in the reference cell strings or by adjusting the specific voltage level Vref.

One advantage of present invention is that the number of transistors required for each reference cell strings, which is typically 9 in a conventional reference cell string, is reduced to 2. A further advantage of the present invention is that the open bit line structure eliminates the need for depletion mode transistors for switching the unit memory cell strings. This greatly reduces the cell array area. Furthermore, since the floating gates of the reference cell transistors are not used (due to the connection between the floating gate and the control gate), variations in the operational characteristics of the reference cell, e.g., shifts in threshold voltage, changes in saturation current, etc. due to repetitive read, erase and program operations, can be suppressed. This stabilizes the performance of the memory device.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A bit line reference circuit for a nonvolatile semiconductor memory device comprising:

a bit line having a first portion and a second portion;

a page buffer electrically connected between the first and second portions of the bit line;

a first reference cell string connected to the first portion of the bit line for providing a reference potential to the first portion of the bit line responsive to a first control signal;

a second reference cell string connected to the second portion of the bit line for providing a second reference potential to the second portion of the bit line responsive to a second control signal;

a first memory cell string connected to the first portion of the bit line; and a second memory cell string connected to the second portion of the bit line.

2. A bit line reference circuit according to claim 1 wherein the first reference cell string includes a transistor having a drain connected to the first portion of the bit line, a source coupled to a ground terminal, and a control gate for receiving the first control signal.

3. A bit line reference circuit according to claim 2 wherein the first reference cell string further includes a second transistor having a drain coupled to the source of the transistor, a source coupled to the ground terminal, and a control terminal for receiving a reference voltage signal.

4. A bit line reference circuit according to claim 2 wherein the transistor includes a floating gate that is electrically connected to the control gate.

5. A bit line reference circuit according to claim 4 wherein the control and floating gates of the transistor are coupled through an abutting contact.

6. A bit line reference circuit according to claim 5 wherein the transistor is fabricated in a cell array, and the control and floating gates are coupled through an abutting contact exterior to the cell array.

7. A bit line reference circuit according to claim 2 wherein the size of the transistor is adjusted so as to adjust the reference potential provided to the first portion of the bit line.

8. A bit line reference circuit according to claim 1 wherein the first memory cell string includes no depletion mode transistors.

9. A bit line reference circuit according to claim 1 wherein the first memory cell string is connected to the first portion of the bit line through one string select transistor.

10. A reference cell string for a bit line in a nonvolatile semiconductor memory device comprising:

a transistor including:
 a drain coupled to the bit line;
 a source coupled to a ground terminal;
 a control gate for receiving a control signal; and
 a floating gate that is physically connected to the control gate.

11. A reference cell string according to claim 10 wherein the control and floating gates of the transistor are coupled through an abutting contact.

12. A reference cell string according to claim 11 wherein the transistor is fabricated in a cell array, and the control and floating gates are coupled through an abutting contact exterior to the cell array.

13. A reference cell string according to claim 10 further including:

a second transistor coupled in series with the first transistor, the second transistor including:
 a drain coupled to the source of the transistor;
 a source coupled to the ground terminal; and
 a control terminal for receiving a reference voltage signal.

14. A reference cell string according to claim 13 wherein the second transistor includes a floating gate that is electrically coupled to the control gate.

15. A reference cell string according to claim 14 wherein the control and floating gates of the second transistor are coupled through an abutting contact.

16. A method for accessing data in a nonvolatile semiconductor memory device using a single bit line, the method comprising:

connecting a page buffer between a first portion of the bit line and a second portion of the bit line;

connecting a first reference cell string to the first portion of the bit line;

connecting a first memory cell string to the second portion of the bit line;

providing a reference potential on the first portion of the bit line from the first reference cell string responsive to a control signal;

selecting the first memory cell string;

providing a data potential on the second portion of the bit line from the first memory cell string; and comparing the potentials of the first and second portions of the bit line with the page buffer, thereby accessing data in the first memory cell string.

17. A method for accessing data according to claim 16 further including:

connecting a second reference cell string to the second portion of the bit line;

connecting a second memory cell string to the first portion of the bit line;

providing a reference potential on the second portion of the bit line with the second reference cell string responsive to a second control signal;

selecting the second memory cell string;

providing a data potential on the first portion of the bit line with the second memory cell string; and comparing the potentials of the first and second portions of the bit line with the page buffer, thereby accessing data in the first memory cell string.

18. A method for accessing data according to claim 17 further including:

activating the control signal while the first memory cell string is selected; and activating the second control signal while the second memory cell string is selected.

19. A method for accessing data according to claim 16 wherein connecting the first reference cell string to the first portion of the bit line includes:

coupling the drain of a first transistor having a control gate and a floating gate to the first portion of the bit line;

coupling the source of a second transistor having a control gate and floating gate to a ground node;

coupling the source of the first transistor to the drain of the second transistor;

driving the control gate of the first transistor with the control signal;

driving the control gate of the second transistor with a reference voltage signal; and electrically connecting the control gate of the second transistor to the floating gate of the second transistor, thereby stabilizing the threshold voltage of the second transistor.

20. A method for accessing data according to claim 19 further including adjusting the voltage of the reference voltage signal, thereby adjusting the reference potential provided on the first portion of the bit line.

* * * * *